United States Patent
Morgner et al.

(10) Patent No.: US 11,217,720 B2
(45) Date of Patent: Jan. 4, 2022

(54) METHOD FOR DEPOSITING A CDTE LAYER ON A SUBSTRATE

(71) Applicants: Fraunhofer-Gesellschaft zur Förderung der angewandten Forschung e.V., Munich (DE); CTF SOLAR GmbH, Dresden (DE)

(72) Inventors: Henry Morgner, Dresden (DE); Christoph Metzner, Dresden (DE); Daniel Hirsch, Dresden (DE); Olaf Zywitzki, Dresden (DE); Ludwig Decker, Dresden (DE); Torsten Werner, Dresden (DE); Bastian Siepchen, Dresden (DE); Bettina Späth, Dresden (DE); Krishnakumar Velappan, Dresden (DE); Christian Kraft, Dresden (DE); Christian Drost, Dresden (DE)

(73) Assignees: FRAUNHOFER-GESELLSCHAFT ZUR FÖRDERUNG DER ANGEWANDTEN FORSCHUNG E.V., Munich (DE); CTF SOLAR GMBH, Dresden (DE)

( * ) Notice: Subject to any disclaimer, the term of this patent is extended or adjusted under 35 U.S.C. 154(b) by 0 days.

(21) Appl. No.: 16/070,039

(22) PCT Filed: Feb. 3, 2017

(86) PCT No.: PCT/EP2017/052323
§ 371 (c)(1),
(2) Date: Jul. 13, 2018

(87) PCT Pub. No.: WO2017/134191
PCT Pub. Date: Aug. 10, 2017

(65) Prior Publication Data
US 2019/0027634 A1  Jan. 24, 2019

(30) Foreign Application Priority Data
Feb. 3, 2016 (DE) .................. 10 2016 101 856.2

(51) Int. Cl.
*H01L 21/00* (2006.01)
*H01L 31/18* (2006.01)
(Continued)

(52) U.S. Cl.
CPC ...... *H01L 31/1828* (2013.01); *C23C 14/0021* (2013.01); *C23C 14/02* (2013.01);
(Continued)

(58) Field of Classification Search
CPC .......... H01L 31/0445; H01L 27/14696; H01L 31/0296; H01L 31/02963; H01L 31/206;
(Continued)

(56) References Cited

U.S. PATENT DOCUMENTS 4,207,119 A  6/1980 Tyan
5,304,499 A  4/1994 Bonnet et al.
(Continued)

FOREIGN PATENT DOCUMENTS

DE  10 2010 051 815 A1  5/2011
DE  10 2014 202 961 A1  8/2015
(Continued)

OTHER PUBLICATIONS

Dr. Dieter Bonnet, "CdTe Dünnschichtsolarmodule auf dem Weg zur Produktion," ["CdTe Thin-Film Solar Modules on their Way to Production"] FVS Themen 2000, dated 2000, pp. 116-118, published by Forschungsverbund Sonnenenergie, Berlin, Germany.
(Continued)

*Primary Examiner* — Caleb E Henry
*Assistant Examiner* — Dilinh P Nguyen
(74) *Attorney, Agent, or Firm* — Crowell & Moring LLP

(57) ABSTRACT

A method for depositing a CdTe layer on a substrate in a vacuum chamber by means of physical gas phase deposition
(Continued)

is provided. The substrate is heated to a coating temperature before the deposition process and then guided past a vessel in which CdTe is converted into a vapour state, a gaseous component with an increased pressure (compared to the vacuum in the vacuum chamber) flowing through at least one inlet, against the substrate surface to be coated, such that the gaseous component is adsorbed on the substrate surface to be coated before the substrate is guided past the at least one vessel.

10 Claims, 2 Drawing Sheets

(51) Int. Cl.
| | | |
|---|---|---|
| *C23C 14/02* | (2006.01) | |
| *C23C 14/06* | (2006.01) | |
| *C23C 14/56* | (2006.01) | |
| *C23C 14/00* | (2006.01) | |
| *C23C 16/30* | (2006.01) | |
| *H01L 31/0445* | (2014.01) | |
| *H01L 27/146* | (2006.01) | |
| *H01L 31/0296* | (2006.01) | |

(52) U.S. Cl.
CPC ........ *C23C 14/0629* (2013.01); *C23C 14/562* (2013.01); *C23C 16/306* (2013.01); *H01L 27/14696* (2013.01); *H01L 31/0296* (2013.01); *H01L 31/0445* (2014.12)

(58) Field of Classification Search
CPC . C23C 14/0021; C23C 14/02; C23C 14/0629; C23C 14/562; C23C 16/306
USPC .......................................................... 438/95
See application file for complete search history.

(56) References Cited

U.S. PATENT DOCUMENTS

| | | | |
|---|---|---|---|
| 2003/0019668 A1* | 1/2003 | Reade | ..................... C30B 23/02 |
| | | | 177/84 |
| 2006/0032440 A1 | 2/2006 | Nolan | |
| 2010/0184249 A1 | 7/2010 | Chen | |
| 2011/0120545 A1 | 5/2011 | Auman et al. | |
| 2012/0097971 A1* | 4/2012 | Jacobs | ................ H01L 29/0657 |
| | | | 257/76 |
| 2014/0051206 A1* | 2/2014 | Allenic | ............... H01L 31/1828 |
| | | | 438/95 |

FOREIGN PATENT DOCUMENTS

| | | |
|---|---|---|
| EP | 0 535 522 A2 | 4/1993 |
| JP | S 6324679 A | 2/1988 |
| JP | H 11195799 A | 7/1999 |
| JP | 2007-317834 | 12/2007 |
| JP | 2010141343 A | 6/2010 |

OTHER PUBLICATIONS

International Search Report issued in International Application No. PCT/EP2017/052323, dated May 3, 2017, pp. 1-3, European Patent Office, Rijswijk, The Netherlands.

Keedong Yang et al., "Vapor transport deposition of large-area polycrystalline CdTe for radiation image sensor application," Physica Status Solidi C, dated Mar. 28, 2014, pp. 1341-1344, vol. 11, No. 7-8, published online by Wiley-VCH Verlag GmbH & Co. KGaA, Weinheim, Germany.

Japanese Office Action for Japanese Patent Application No. 2018-540719, pp. 1-14, dated Mar. 11, 2021, Japanese Patent Office, Japan.

\* cited by examiner

METHOD FOR DEPOSITING A CDTE LAYER ON A SUBSTRATE

This application is a 371 nationalization of international patent application PCT/EP2017/052323 filed Feb. 3, 2017, which claims priority under 35 USC § 119 to German patent application DE 10 2016 101 856.2, filed Feb. 3, 2016. The entire contents of each of the above-identified applications are hereby incorporated by reference.

BRIEF DESCRIPTION OF THE DRAWINGS

The embodiments may be better understood with reference to the following drawings and description.

DETAILED DESCRIPTION

Figure 1:
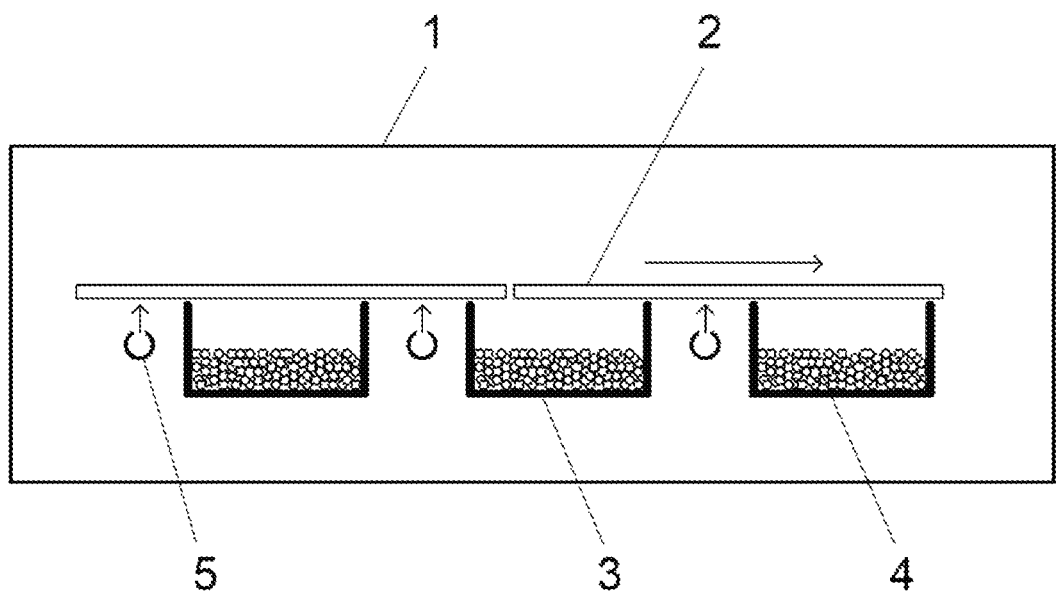
FIG. 1 shows a schematic diagram of a device by means of which the method of the invention is performable.

The invention relates to a method of depositing a CdTe layer on a substrate, with which at least one additional chemical element can be intercalated into the deposited layer.

CdTe layers are gaining increasing significance in the semiconductor industry, primarily in the production of thin-film solar cells or image sensors for cameras.

For the deposition of CdTe layers the process methodology of "close space sublimation" with the abbreviation CSS is in widespread use. In this methodology, granular CdTe is heated in a vessel, which sublimes in the vessel and hence is converted to a vaporous state. A substrate which is to be coated and heated to coating temperature is moved over the vessel, usually at close quarters, as a result of which CdTe is deposited on the substrate surface.

The deposition of CdTe layers by means of CSS for thin-film solar cells is described, for example, in "CdTe Dünnschichtsolarmodule auf dem Weg zur Produktion" [CdTe Thin-Film Solar Cell Modules on the Way to Production], Dr. Dieter Bonnet, FVS Themen 2000, pages 116-118.

DE 10 2014 202 961 A1 discloses a method of producing a p-doped CdTe layer in which two CdTe sublayers are deposited, for example by means of CSS, and a sacrificial layer comprising the doping element between the two sublayers. The doping element diffuses from the sacrificial layer into adjoining regions of the CdTe sublayers.

Alternatively, it is also possible to conduct a reactive deposition operation in the CSS process by admitting a reactive gas, for example oxygen, into the region of the spreading CdTe vapor between subliming granular CdTe and the substrate to be coated. A disadvantage here is found to be that the granular CdTe is also oxidized in the vessel, which has an adverse effect on the vapor yield.

A further known process for deposition of CdTe layers is what is called "Vapor Transport Deposition", abbreviated to VTD. In the VTD deposition method, CdTe is converted to the vaporous state in a vessel and the CdTe vapor is guided by means of the gas stream of an inert carrier gas into a coating zone in which the CdTe vapor is deposited on a substrate. The VTD deposition method is usually used for coating of the top side of a substrate with the coating direction from the top downward. DE 10 2010 051 815 A1 discloses, for example, a process for forming at least one photovoltaic component in which an absorber layer which is produced from CdTe, for example, can be deposited by means of VTD.

"Vapor transport deposition of large-area polycrystalline CdTe for radiation image sensor application", Keedong Yang, Bokyung Cha, Duchang Heo, and Sungchae Jeon, Phys. Status Solidi, C 11, No. 7-8, 2014, pages 1341-1344, describes the deposition of CdTe layers by means of VTD for image sensor applications.

In the case of deposition of a CdTe layer by means of VTD, it is possible to intercalate further chemical elements into the CdTe layer, for example by adding a gaseous component of the chemical element to be incorporated to the carrier gas. If oxygen, for example, is added to the inert carrier gas, however, this has an adverse effect in that the oxygen reacts with particles of the CdTe vapor to give cadmium oxide during the transport of the CdTe vapor to the coating zone, which reduces the quality of the layer deposited.

The invention is therefore based on the technical problem of providing a method of depositing a CdTe layer on a substrate, by means of which the disadvantages from the prior art can be overcome. More particularly, it is also to be possible by the method of the invention to intercalate additional chemical elements into the layer deposited without bringing about any chemical change in the material being evaporated, for example through oxidation.

In the method of the invention, a CdTe layer is deposited on a substrate by means of physical gas phase deposition within a vacuum chamber. Substrates used may, for example, be glass substrates on which one or more layers of materials other than CdTe may already have been deposited prior to the deposition of the CdTe layer. Alternatively, it is also possible to use substrates of metal or of plastic. In the method of the invention, a substrate to be coated with CdTe, prior to the deposition process, is heated to a coating temperature and then moved past at least one vessel in which CdTe is converted to a vaporous state, in such a way that the CdTe vapor formed is deposited on the surface of the substrate to be coated. It is a feature of the method of the invention that at least one further chemical element which can affect the electrical conductivity of the CdTe layer, for example, is intercalated into the CdTe layer deposited. This is achieved in accordance with the invention in that a gaseous component having an elevated pressure (relative to the vacuum in the vacuum chamber) flows through at least one inlet against the surface of the substrate to be coated, such that the gaseous component is adsorbed on the surface of the substrate to be coated before the substrate is guided past the at least one vessel in which CdTe is converted to a vaporous state. The gaseous component adhering on the substrate surface is then also incorporated into the layer that forms in the subsequent vapor deposition of the CdTe.

The method of the invention can be executed, for example, using a gaseous component comprising at least one of the elements from the group of oxygen, nitrogen, sulfur, chlorine, fluorine, phosphorus, arsenic, antimony, bismuth, tellurium. Oxygen as a gaseous component is particularly suitable when the CdTe layer is deposited as a constituent of a solar cell layer system because the intercalated oxygen enhances the desired diffusion of chlorine and sulfur into the CdTe layer from adjoining layers, which brings about an elevated efficiency in the solar cell.

In one embodiment of the invention, the substrate is repeatedly moved past the at least one vessel in which CdTe is converted to a gaseous state, with adsorption of a gaseous component at the surface of the substrate to be coated before each entrance of the substrate into the coating zone of the vessel. These may be the same gaseous components every time or else different gaseous components from time to time. Alternatively, it is also possible for multiple vessels in which CdTe is converted to a vaporous state to be arranged in succession in a vacuum chamber, viewed in direction of movement of a substrate, with adsorption of a gaseous component on the surface of the substrate to be coated each time before a substrate enters the coating zone of a vessel, in that the gaseous component flows through at least one inlet against the surface of the substrate to be coated.

In a further embodiment, the gaseous component is activated by means of a plasma before and/or after the adsorbing on the substrate surface, which can improve the incorporation of chemical elements of the gaseous component into the CdTe layer.

Preferably, a CdTe layer is deposited in the method of the invention by means of a CSS process. Alternatively, a CdTe layer can also be deposited in accordance with the invention by means of VTD.

It is also possible in the method of the invention for the CdTe vapor to be activated by means of a plasma, which can influence the properties of the CdTe layer deposited.

The present invention is elucidated in detail hereinafter by a working example. FIG. 1 shows a schematic diagram of a device by means of which the method of the invention is performable. Substrates 2, on one side of which a CdTe layer is to be deposited as part of a solar cell layer system, are guided through a vacuum chamber 1. The chemical element oxygen is also to be intercalated very uniformly into the deposited CdTe layer.

In the working example, the substrates consist of glass, on which a TCO layer and subsequently a CdS layer have already been deposited in preceding processes. Before the substrates 2 are guided into the vacuum chamber 1, these have been heated to a coating temperature. The heating of the substrates 2 to a coating temperature or the maintaining of a coating temperature of the substrates 2 can alternatively also be effected within the vacuum chamber 1, for example by means of radiative heaters.

Within the vacuum chamber 1, there are three vessels 3 arranged in direction of substrate movement, which is illustrated by an arrow above the substrates 2. Within the vessels 3 there is granular CdTe 4, which sublimes owing to supply of heat to the vessels 3. The substrates 2 are guided over the vessels 3 at a distance of just a few millimeters, as a result of which a CdTe layer is deposited on the substrates 2.

According to the invention, viewed in direction of substrate movement, there is a gas inlet 5 disposed upstream of each vessel 3, out of which oxygen flows in the direction of the substrate surface to be coated. The flow direction of the oxygen in the working example is at right angles to the substrate surface to be coated. The oxygen is adsorbed on the substrate surface to be coated, is guided adhering to and together with the substrate 2 into the coating zone of a downstream vessel 3 and incorporated into the layer deposited in the layer deposition there.

If a substrate 2, as described in the working example, is guided repeatedly through the coating zone of one or more vessels 3 and a gaseous component is adsorbed beforehand on the substrate surface to be coated each time, the method of the invention provides a means of incorporating at least one additional chemical element uniformly across the layer thickness profile of a CdTe layer.

Because the substrates 2 are guided over the vessels 3 at a distance of just a few millimeters, firstly, the lateral evaporation losses are very small and, secondly, only very little oxygen gets to the granular CdTe owing to the small gap between substrate 2 and the vessel edge in connection with the relatively high vapor pressure that builds up within the vessel 3 in the region between granular CdTe 4 and the substrate 2. As a result, the degree of oxidation of the granular CdTe within the vessels 3 is negligibly small and the vapor yield is very high.

It is known that, in the case of a solar cell layer system, the deposition of a CdTe layer is followed by activation of the CdTe layer with a chlorine compound in such a way that chlorine is to diffuse into the CdTe layer. It has been found that, surprisingly, the inventive intercalation of oxygen into a CdTe layer promotes both the inward diffusion of chlorine owing to subsequent chlorine activation and the inward diffusion of sulfur from a CdS layer deposited beneath the CdTe layer. In the case of solar cells having a CdTe layer deposited in accordance with the invention, it was therefore possible to ascertain higher efficacy compared to methods without oxygen intercalated in accordance with the invention.

An analysis of CdTe layers deposited in accordance with the invention has also shown that the inventive intercalation of oxygen into a CdTe layer does not lead to formation of cadmium oxide within the CdTe layer.

Figure 2:
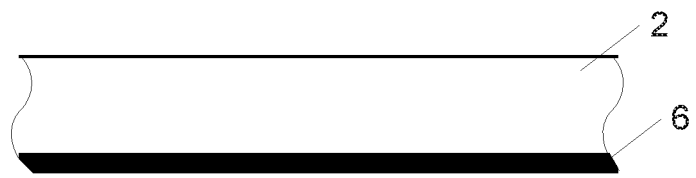
FIG. 2 schematically shows a portion of a substrate on which a CdTe layer is deposited.

It should be noted once again that the method of the invention is capable not just of incorporating oxygen into a CdTe layer but also other chemical elements that have already been named above, in order for example to dope the CdTe layer. The three vessels 3 shown in FIG. 1 are also merely illustrative in terms of their number. Depending on an objective, the method of the invention can also be conducted with more or fewer than three vessels 3 and the corresponding gas inlets 5. FIG. 2 schematically shows a portion of the substrate 2 on which a CdTe layer 6 is deposited.

The invention claimed is:

1. A method of depositing a CdTe layer on a substrate within a vacuum chamber by means of close space sublimation (CSS), the method comprising:
   heating the substrate, prior to the deposition process, to a coating temperature;
   guiding the substrate past multiple vessels in which CdTe is sublimed are arranged in succession in a direction of movement of the substrate, wherein upstream of each of the vessels a gaseous component includes oxygen and having an elevated pressure relative to the vacuum in the vacuum chamber flows through at least one inlet against a surface of the substrate to be coated, wherein the gaseous component, which does not include CdTe vapor, is adsorbed at the surface of the substrate to be coated before the substrate is guided past the next vessel, wherein a chemical element of the gaseous component adsorbed at the surface of the substrate is intercalated into the CdTe layer formed by deposition of the CdTe in the vaporous state.

2. The method of claim 1, wherein the gaseous component is activated by means of a plasma.

3. The method of claim 1, wherein the CdTe vapor is activated by means of a plasma.

4. A method of depositing a CdTe layer on a substrate within a vacuum chamber by means of physical gas phase deposition, the method comprising:
   heating the substrate to a coating temperature;
   flowing, after the substrate is heated to the coating temperature, a gaseous component having an elevated pressure relative to the vacuum in the vacuum chamber through at least one inlet against a surface of the substrate on which the CdTe layer is to be deposited, wherein the gaseous component, which does not include CdTe vapor, is adsorbed at the surface of the substrate; and depositing the CdTe layer on the substrate by guiding the substrate, after flowing the gaseous component against the surface of the substrate, past at least one vessel in which CdTe is converted to a vaporous state and subsequently forms the CdTe layer on the substrate, wherein a chemical element of the gaseous component adsorbed at the surface of the substrate is intercalated into the CdTe layer formed by deposition of the CdTe layer, wherein the at least one inlet includes a plurality of inlets and the at least one vessel includes multiple vessels in which CdTe is sublimed, wherein the multiple vessels are arranged in succession in a direction of movement of the substrate, and upstream of each of the vessels, the gaseous component having the elevated pressure relative to the vacuum in the vacuum chamber flows through a corresponding one of the inlets against the surface of the substrate to be coated.

5. The method of claim 4, wherein the gaseous component comprises at least one of oxygen, nitrogen, sulfur, chlorine, fluorine, phosphorus, arsenic, antimony, bismuth, or tellurium.

6. The method of claim 4, wherein the substrate is guided repeatedly past the at least one vessel.

7. The method of claim 4, wherein the gaseous component is activated by means of a plasma.

8. The method of claim 4, wherein the CdTe layer is deposited by means of close space sublimation (CSS).

9. The method of claim 4, wherein the CdTe vapor is activated by means of a plasma.

10. The method of claim 4, wherein the gaseous component includes oxygen.

* * * * *